(12) United States Patent
Kumagawa et al.

(10) Patent No.: US 9,209,750 B2
(45) Date of Patent: Dec. 8, 2015

(54) HARMONIC REJECTION MIXER

(71) Applicant: PANASONIC CORPORATION, Osaka (JP)

(72) Inventors: Masahiro Kumagawa, Hyogo (JP); Yuusuke Yamaoka, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/396,150

(22) PCT Filed: Dec. 25, 2013

(86) PCT No.: PCT/JP2013/007559
§ 371 (c)(1),
(2) Date: Oct. 22, 2014

(87) PCT Pub. No.: WO2014/132316
PCT Pub. Date: Sep. 4, 2014

(65) Prior Publication Data
US 2015/0084683 A1    Mar. 26, 2015

(30) Foreign Application Priority Data

Feb. 26, 2013   (JP) .................................. 2013-035629

(51) Int. Cl.
*G06F 7/44* (2006.01)
*G06G 7/14* (2006.01)
*H03D 7/14* (2006.01)
*H03D 7/16* (2006.01)
*H03D 7/12* (2006.01)

(52) U.S. Cl.
CPC ............. *H03D 7/1475* (2013.01); *H03D 7/125* (2013.01); *H03D 7/1441* (2013.01); *H03D 7/165* (2013.01); *H03D 2200/0074* (2013.01); *H03D 2200/0086* (2013.01)

(58) Field of Classification Search
CPC ........................... H03D 7/1475; H03D 7/1441
USPC ........................... 327/355–361; 455/323, 326
See application file for complete search history.

(56) References Cited

U.S. PATENT DOCUMENTS 8,140,044 B2 *  3/2012  Villain et al. ................. 455/313
8,203,375 B2 *  6/2012  de Jong et al. ................ 327/359

(Continued)

FOREIGN PATENT DOCUMENTS

JP    2007-535830 A    12/2007
JP    2012-065017 A     3/2012
JP    2012-165097 A     8/2012

OTHER PUBLICATIONS

International Search Report for Application No. PCT/JP2013/007559 dated Apr. 8, 2014.

(Continued)

*Primary Examiner* — Dinh Le
(74) *Attorney, Agent, or Firm* — Pearne & Gordon LLP

(57) ABSTRACT

A harmonic rejection mixer is disclosed that is capable of supporting wideband reception without any increase in circuit area. In this apparatus, transistors convert an RF signal to currents. Transistors perform frequency conversion based on the currents from the transistors and local oscillation signals. Transistors distribute the currents from the transistors to all transistors or some transistors based on a predetermined ratio. A load adds up the currents from the transistors and converts the resultant current to a voltage.

6 Claims, 12 Drawing Sheets

(56) References Cited

U.S. PATENT DOCUMENTS

2007/0112904 A1  5/2007  Kasperkovitz
2009/0138744 A1  5/2009  Kasperkovitz
2012/0064850 A1  3/2012  Matsui

OTHER PUBLICATIONS

Aslam A Rafi, et al, "A Harmonic Rejection Mixer Robust to RF Device Mismatches" ISSCC 2011/ Session 3/ RF Techniques/ 3.8, Austin, TX.

* cited by examiner

… (N+2)): … :sin((N+1)×180°/(N+2)). The phase difference between given LO signals is assumed to be 180°/(N+2).

HARMONIC REJECTION MIXER

TECHNICAL FIELD

The present invention relates to a multiband supporting harmonic rejection mixer.

BACKGROUND ART

In radio signal reception systems, a mixer multiplies an RF (radio frequency) signal amplified using a low noise amplifier by an LO (local oscillator) signal generated by a built-in PLL (phase locked loop) or the like. The mixer thereby frequency-converts the RF signal to an IF (intermediate frequency) signal or baseband signal.

An LO signal is given as a rectangular wave. However, the rectangular wave includes not only a fundamental wave component f but also odd-number-order harmonic components 3f, 5f, 7f, and so forth. For that reason, an RF signal which is not a desired signal is also mixed in the output of the mixer in the same frequency band as that of the desired signal. For example, in a direct conversion system, not only a desired wave fd but also components of 3fd, 5fd and 7fd are mixed in as the same baseband signal as the desired wave fd.

A harmonic rejection mixer (hereinafter, referred to as "HRM") is used to suppress harmonic components. An HRM includes a plurality of switching devices that mix an RF signal and an LO signal, a gain device that determines a gain of the output of each switching device and an adder that adds up outputs of the gain devices.

The phase of the LO signal given to the switching device corresponding to the gain of the gain device is set to a special value that can suppress harmonic components. For example, a 3-phase HRM is provided with 3 switching devices. The gains of the gain devices connected to the respective switching devices are set to a ratio of 1:√2:1. At this time, the phases of the LO signal are given while being shifted by 45° each such as 0°, 45° and 90°. The outputs of the switching devices are added up by an adder. By so doing, the third-order and fifth-order harmonics are suppressed.

In general, when N=1, 2, 3, 4, . . . , odd-number-order harmonics such as third-order to (2N+1)th-order harmonics are suppressed as follows. That is, in a (N+1)-phase HRM, the gain ratio is assumed to be sin(1×180°/(N+2)):sin(2×180°/(N+2)): . . . :sin((N+1)×180°/(N+2)). The phase difference between given LO signals is assumed to be 180°/(N+2).

Wireless sensor systems expected to be in widespread use in the M2M (Machine to Machine) field in the future are estimated to use a plurality of frequency bands of 400 MHz to 5.2 GHz. Therefore, the HRM is required to support wideband reception. On the other hand, as the number of phases increases and as the receiving frequency increases, the HRM needs to generate and drive multi-phase LO signals at a high frequency, which results in an increase in current consumption.

Under such circumferences, when attempting to support wideband reception, the HRM encounters a problem in that there may be waste in current consumption depending on the number of phases. This problem will be described with a case corresponding to reception of 400 MHz to 5.2 GHz as an example. That is, in order to support reception of 400 MHz, it is necessary to suppress harmonics of up to the 13-th order. Thus, the HRM operates as a 7-phase HRM. On the other hand, in order to support reception of 1 GHz, harmonics of up to the fifth order may be suppressed. Thus, it is sufficient that the HRM operates as a 3-phase HRM. That is, upon receiving 1 GHz, if the HRM operates as a 7-phase HRM, there is a problem in that there may be waste in current consumption.

NPL 1 discloses a technique for solving such a problem, for example. According to the technique of NPL 1, current consumption is suppressed by reducing the number of phases of an HRM when a receiving frequency is high.

CITATION LIST

Non-Patent Literature

NPL 1

Aslam A Rafi et al., "A Harmonic Rejection Mixer Robust to RF Device Mismatches," ISSCC DIGEST OF TECHNICAL PAPERS, pp. 66-67, February 2011.

SUMMARY OF INVENTION

Technical Problem

However, the technique of NPL 1 provides HRMs with different numbers of phases separately, resulting in a problem that the circuit area increases.

An object of the present invention is to provide a harmonic rejection mixer capable of supporting wideband reception without any increase in the circuit area.

Solution to Problem

A harmonic rejection mixer according to an aspect of the present invention includes: 2N+1 gain devices that convert a radio frequency signal to currents; 2N+1 switching devices that perform frequency conversion based on the currents from the gain devices and local oscillation signals; an adder that adds up the currents from the switching devices and that converts a resultant current to a voltage; and a changeover switch that distributes the currents from the gain devices to the 2N+1 switching devices or N switching devices based on a predetermined ratio.

Advantageous Effects of Invention

The present invention makes it possible to support wideband reception without any increase in circuit area.

DESCRIPTION OF EMBODIMENTS

Hereinafter, embodiments of the present invention will be described with reference to the accompanying drawings.

Embodiment 1

Figure 1:
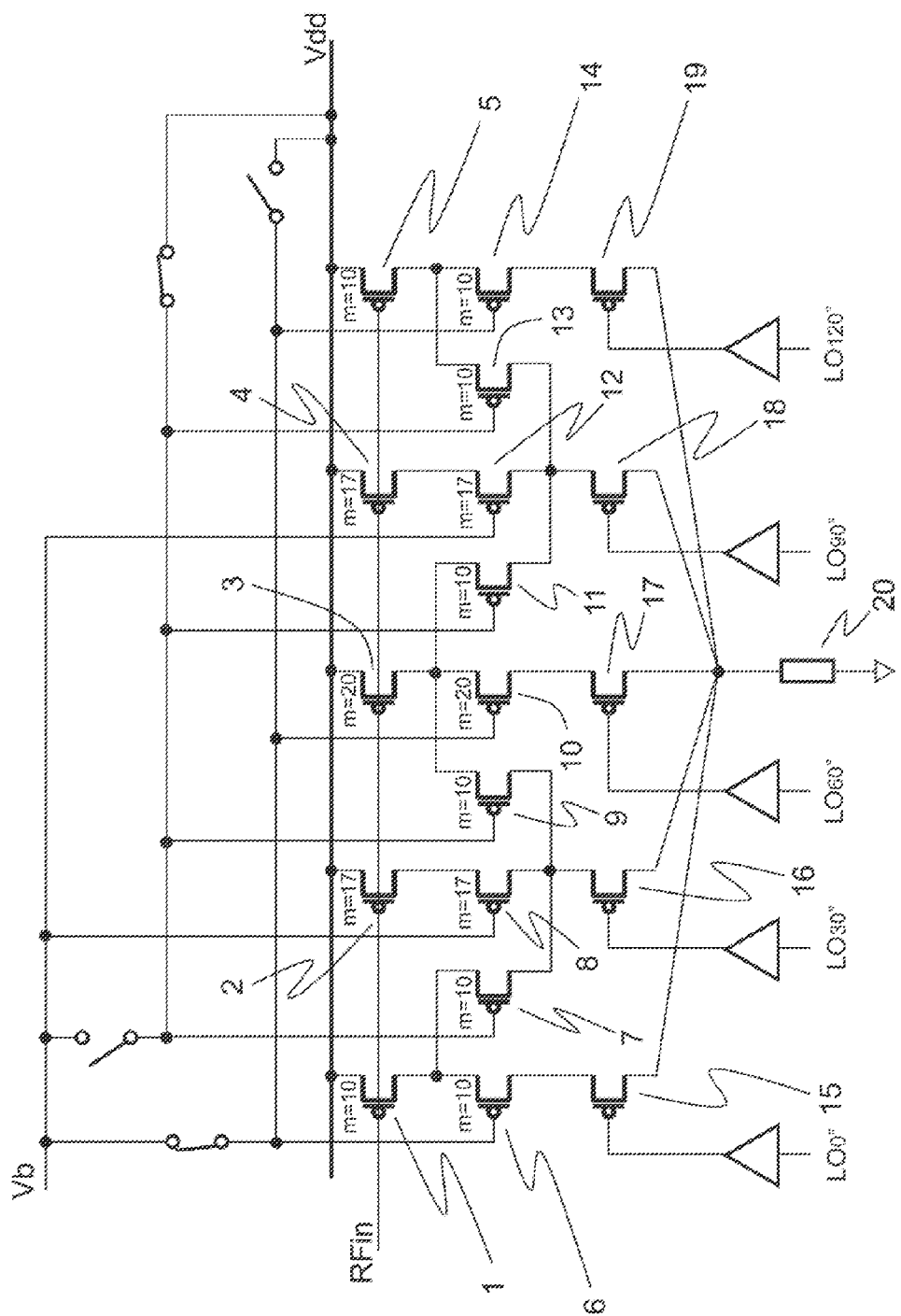
FIG. 1 is a configuration diagram of an HRM according to Embodiment 1 of the present invention.

Embodiment 1 of the present invention will be described. An HRM according to the present embodiment can switch between 5-phase and 2-phase HRMs and adopts a configuration using transistors for gain devices. FIG. 1 is a diagram illustrating a configuration example of the HRM according to the present embodiment.

In FIG. 1, transistors 1 to 5 are gm devices that receive an RF signal through common gates and convert the RF signal to a current. Transistors 1 to 5 are also called "gm transistors." The size ratio (m) of transistors 1 to 5 is 10:17:20:17:10. Thus, the ratio by which the RF signal is converted to a current is 10:17:20:17:10.

Transistors 6 to 14 are devices that take on a role of cascode transistors for the gm devices (transistors 1 to 5) with a bias voltage Vb or supply voltage Vdd given to their gates. This cascode transistor is used as a changeover switch that changes the number of phases (gm current output destination). Thus, transistors 6 to 14 are also called "changeover transistor." Furthermore, transistors 6 to 14 are devices that also take on a role of preventing an LO signal from being leaked to the RF input end. The size ratio (m) of transistors 6 to 14 is 10:10:17:10:20:10:17:10:10.

Transistors 15 to 19 are switching devices that receive LO signals whose phases differ by 30° from one another, switch between the gm currents and perform frequency conversion. Thus, transistors 15 to 19 are also called "switching transistors." The LO signals are LO_0°, LO_30°, LO_60°, LO_90° and LO_120°.

Load 20 is an adder that adds up the gm currents switched by transistors 15 to 19 and converts the resultant current to a voltage.

Such an HRM of the present embodiment can switch between 5 phases and 2 phases by using transistors 6 to 14 as switches for changing the number of phases. Thus, with the configuration shown in FIG. 1, the HRM of the present embodiment can operate as a 5-phase HRM as well as a 2-phase HRM.

Figure 2:
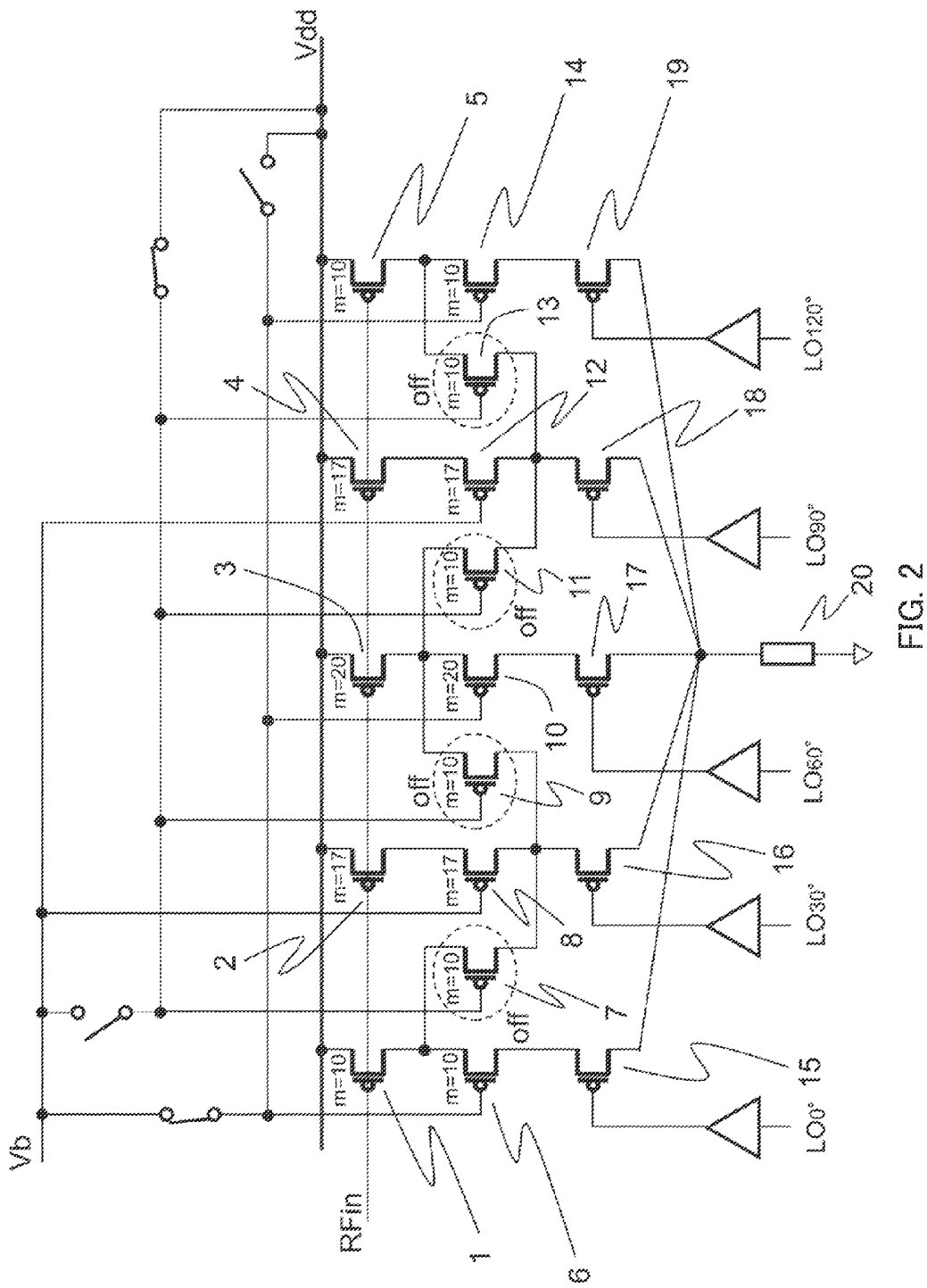
FIG. 2 is a configuration diagram when the HRM according to Embodiment 1 of the present invention operates as a 5-phase HRM.

FIG. 2 illustrates a case where the HRM operates as a 5-phase HRM (hereinafter described as "during 5-phase operation"). As shown in FIG. 2, the gates of transistors 6, 8, 10, 12 and 14 are each given a bias voltage Vb. Transistors 7, 9, 11 and 13 are turned OFF. LO signals are turned ON for all five phases.

Figure 3:
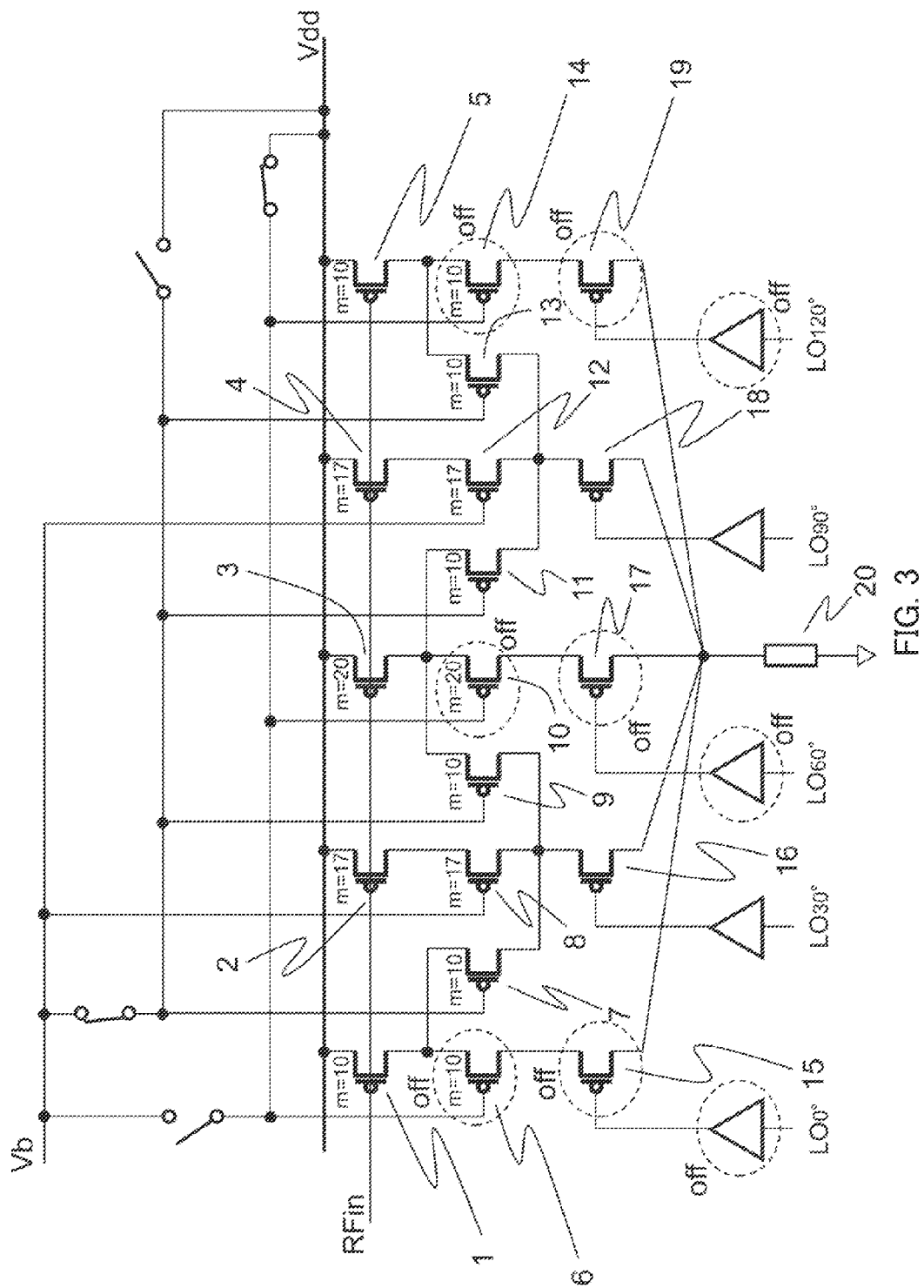
FIG. 3 is a configuration diagram when the HRM according to Embodiment 1 of the present invention operates as a 2-phase HRM.

FIG. 3 illustrates a case where the HRM operates as a 2-phase HRM (hereinafter described as "during 2-phase operation"). As shown in FIG. 3, the gates of transistors 7, 8, 9, 11, 12 and 13 are each given the bias voltage Vb. Transistors 6, 10 and 14 are turned OFF. As for LO signals, LO_30° and LO_90° are turned ON, and LO_0°, LO_60° and LO_120° are turned OFF.

As described above, the size ratio of transistor 9 and transistor 11 is set to 10:10. Thus, during 2-phase operation, transistor 9 and transistor 11 distribute a gm current produced at transistor 3 to transistor 16 switched by LO_30° and transistor 18 switched by LO_90° based on a ratio of 10:10.

During 2-phase operation, transistor 7 distributes all the gm current produced at transistor 1 to transistor 16 switched by LO_30°.

During 2-phase operation, transistor 13 distributes all the gm current produced at transistor 5 to transistor 18 switched by LO_90°.

By so doing, the ratio of gm currents switched by LO_30° and LO_90° during 2-phase operation becomes 10+17+10:10+17+10=37:37. Since this is equivalent to 1:1, this is the gain ratio for operating as a 2-phase HRM.

As described above, according to the HRM of the present embodiment, since the HRM is provided with transistors 6 to 14 that function as switches for changing the number of phases, the HRM can operate either as a 5-phase HRM or as a 2-phase HRM without a substantial increase in the circuit area. In other words, changeover to a 2-phase HRM is possible by adding four cascode transistors (transistors 7, 9, 11 and 13) to five cascode transistors (transistors 6, 8, 10, 12 and 14) when configuring a 5-phase HRM. While the ratio of cascode transistors is 10+17+20+17+10=74 during 5-phase operation, it is 10+10+10+10=40 during 2-phase operation, and therefore it is possible to realize both the 5-phase HRM and the 2-phase HRM by only using approximately 1.5 times as many cascode transistors. That is, the HRM of the present embodiment is capable of supporting wideband reception without any increase in the circuit area.

Embodiment 2

Figure 4:
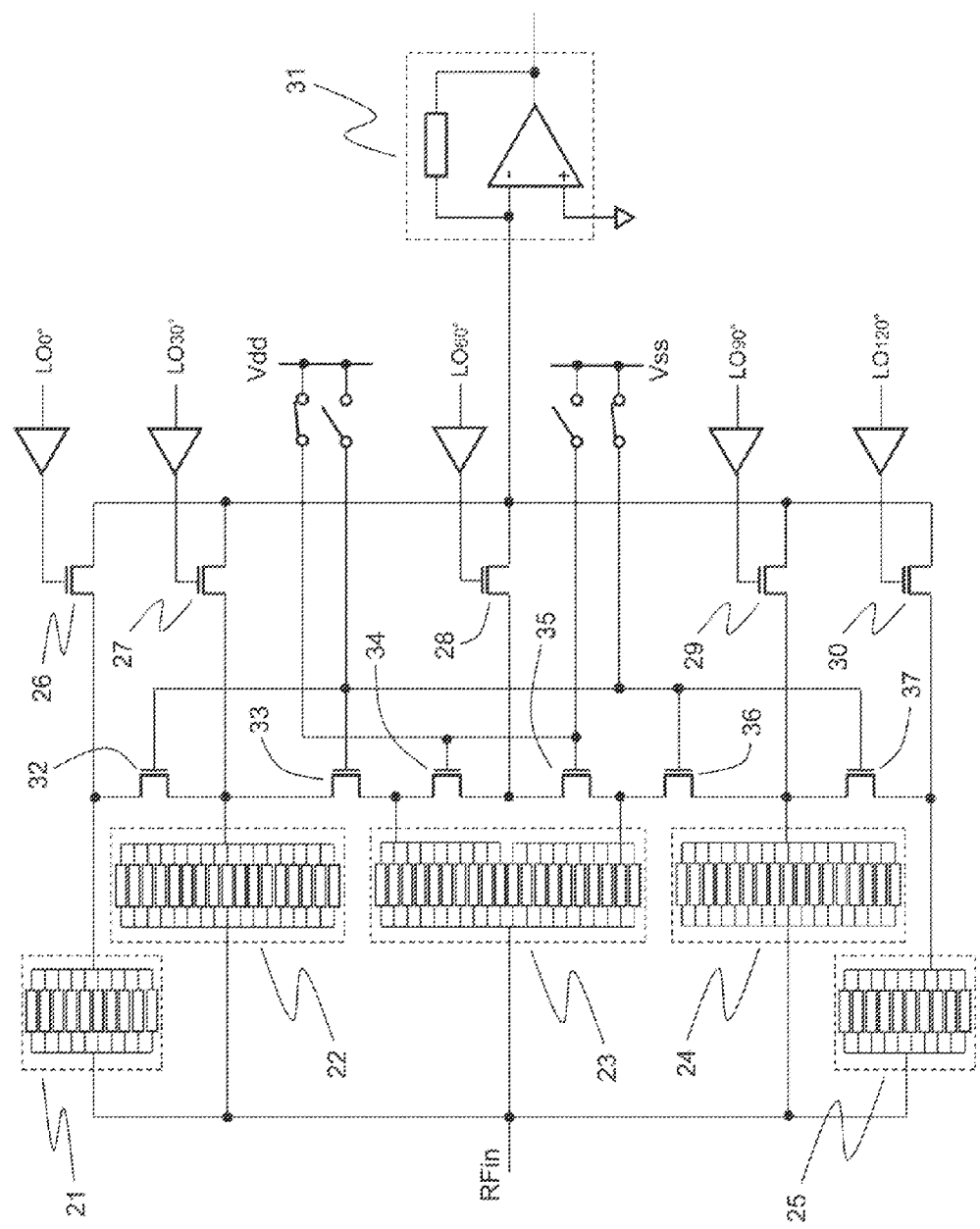
FIG. 4 is a configuration diagram of an HRM according to Embodiment 2 of the present invention.

Embodiment 2 of the present invention will be described. An HRM according to the present embodiment is switchable between 5-phase and 2-phase HRMs and adopts a configuration using resistors for gain devices. FIG. 4 illustrates a configuration example of the HRM according to the present embodiment.

In FIG. 4, resistors 21 to 25 are devices that receive an RF signal and convert the RF signal to a current. The ratio of resistance values of resistors 1 to 25 is 1/10:1/17:1/20:1/17:1/10. In this way, the ratio of conversion to a current becomes 10:17:20:17:10. The ratio of resistance values, 1/10:1/17:1/20:1/17:1/10 is realized by connecting 10 unit resistors having a resistance value R in parallel, connecting 17 unit resistors in parallel, connecting 20 unit resistors in parallel, connecting 17 unit resistors in parallel, and connecting 10 unit resistors in parallel.

Transistors 26 to 30 are switching devices that receive LO signals whose phases differ by 30° from one another and perform frequency conversion. LO signals are LO_0°, LO_30°, LO_60°, LO_90° and LO_120°.

Gates of transistors 32 to 37 are given a bias voltage Vb or a supply voltage Vss. Transistors 32 to 37 function as switches for changing the number of phases.

Feedback operational amplifier 31 is an adder that adds up currents switched by transistors 26 to 30 and converts the resultant current to a voltage.

Such an HRM of the present embodiment uses transistors 32 to 37 as switches for changing the number of phases, and can thereby switch between 5-phase and 2-phase HRMs. Therefore, the HRM of the present embodiment in the configuration shown in FIG. 4 can operate either as a 5-phase HRM or as a 2-phase HRM.

Figure 5:
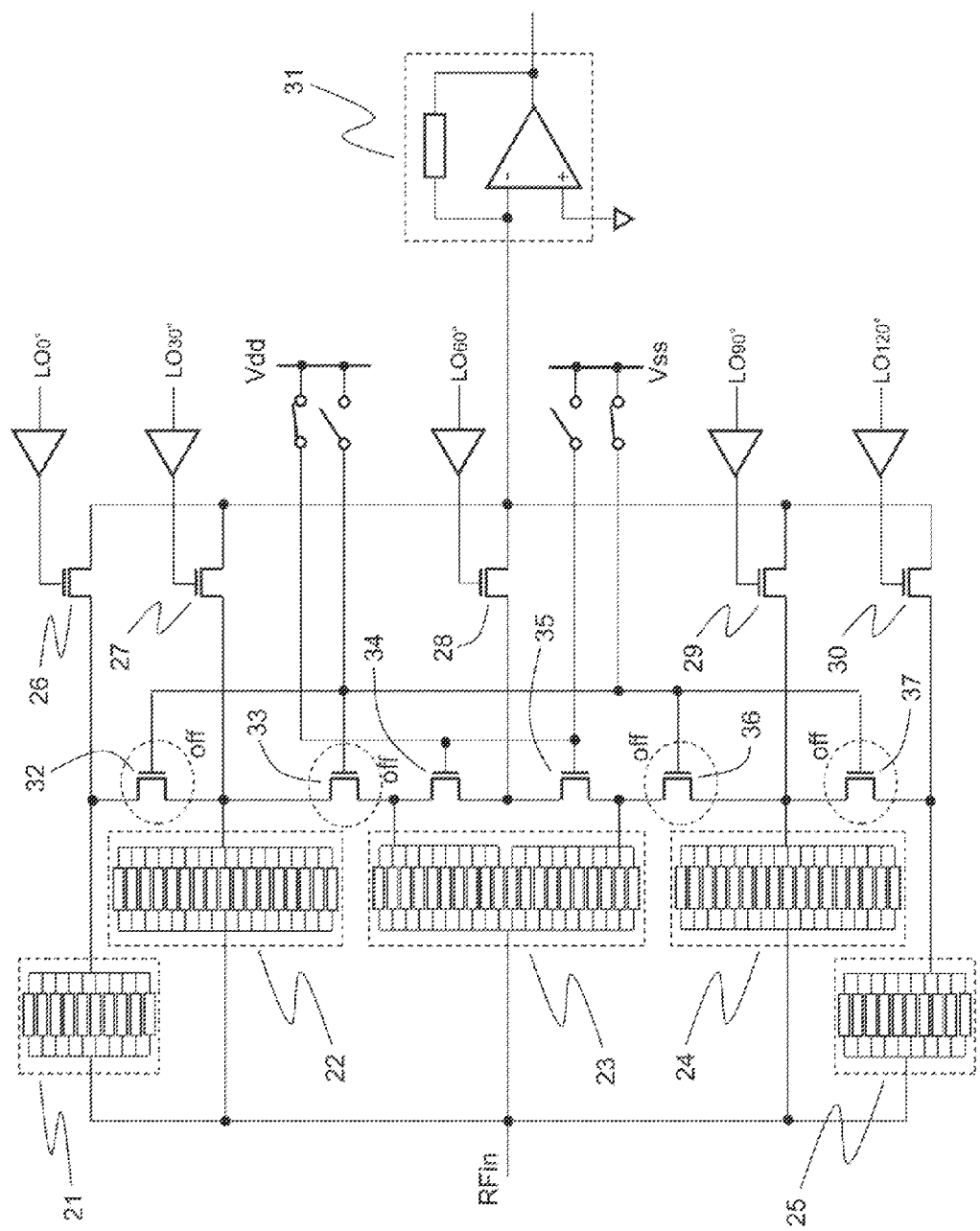
FIG. 5 is a configuration diagram when the HRM according to Embodiment 2 of the present invention operates as a 5-phase HRM.

FIG. 5 illustrates a configuration during 5-phase operation. As shown in FIG. 5, of transistors 32 to 37, transistors 34 and 35 are turned ON and transistor 32, 33, 36 and 37 are turned OFF. LO signals are given for all five phases.

Figure 6:
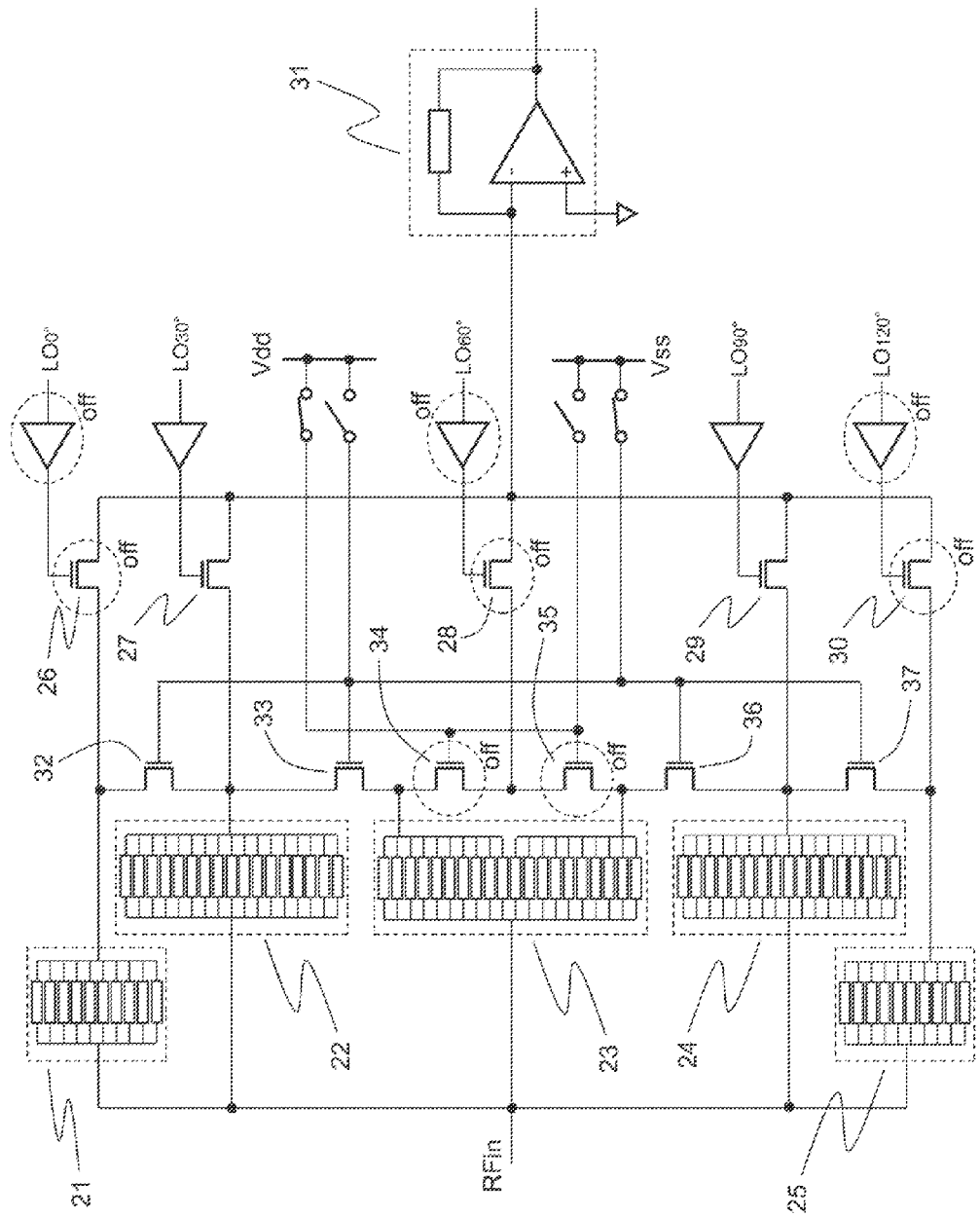
FIG. 6 is a configuration diagram when the HRM according to Embodiment 2 of the present invention operates as a 2-phase HRM.

FIG. 6 illustrates a configuration during 2-phase operation. As shown in FIG. 6, of transistors 32 to 37, transistors 34 and 35 are turned OFF, and transistors 32, 33, 36 and 37 are turned ON. As for LO signals, LO__30° and LO__90° are turned ON, and LO__0°, LO__60° and LO__120° are turned OFF.

By so doing, the ratio of currents switched by LO__30° and LO__90° during 2-phase HRM operation becomes 10+17+10:10+17+10=37:37. Since this is equivalent to 1:1, this is the gain ratio for operating as a 2-phase HRM.

As described above, according to the HRM of the present embodiment, since the HRM is provided with transistors 32 to 37 that function as switches for changing the number of phases, the HRM can operate either as a 5-phase HRM or as a 2-phase HRM without a substantial increase in the circuit area. That is, the HRM of the present embodiment is capable of supporting wideband reception without any increase in the circuit area.

Embodiment 3

Figure 7:
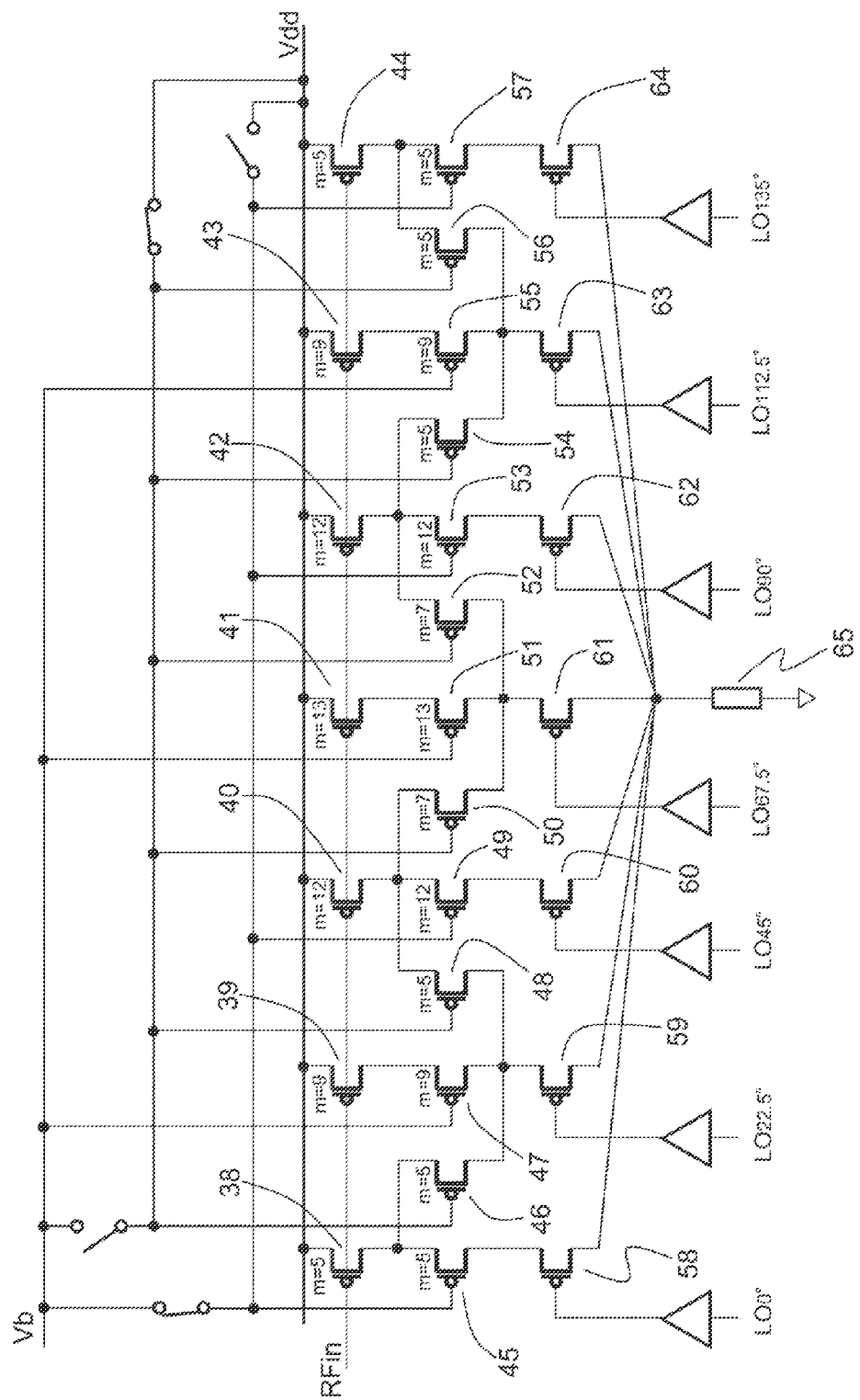
FIG. 7 is a configuration diagram of an HRM according to Embodiment 3 of the present invention.

Embodiment 3 of the present invention will be described. An HRM according to the present embodiment is switchable between 7-phase and 3-phase HRMs and adopts a configuration using transistors for gain devices. FIG. 7 illustrates a configuration example of the HRM according to the present embodiment.

In FIG. 7, transistors 38 to 44 are gm devices that receive an RF signal through common gates and convert the RF signal to a current. The size ratio (m) of transistors 38 to 44 is 5:9:12:13:12:9:5. In this way, the ratio of conversion to a current becomes 5:9:12:13:12:9:5.

Transistors 45 to 57 are devices that take on a role of cascode transistors for gm devices (transistors 38 to 44) with a bias voltage Vb or supply voltage Vdd given to gates thereof. These cascode transistors are used as changeover switches to change the number of phases. Furthermore, transistors 45 to 57 are devices that also take on a role of preventing an LO signal from leaking into the RF input end. The size ratio of transistors 45 to 57 is 5:5:9:5:12:7:13:7:12:5:9:5:5.

Transistors 58 to 64 are switching devices that receive LO signals whose phases differ by 22.5° from one another, switch between the gm currents and perform frequency conversion. The LO signals are LO__0°, LO__22.5°, LO__45°, LO__67.5°, LO__90°, LO__112.5° and LO__135°.

Load 65 is an adder that adds up gm currents switched by transistors 58 to 64 and converts the resultant current to a voltage.

In such an HRM of the present embodiment, changeover between 7 phases and 3 phases is possible by using transistors 45 to 57 as switches for changing the number of phases. Thus, the HRM of the present embodiment in the configuration shown in FIG. 7 can operate as a 7-phase HRM as well as a 3-phase HRM.

Figure 8:
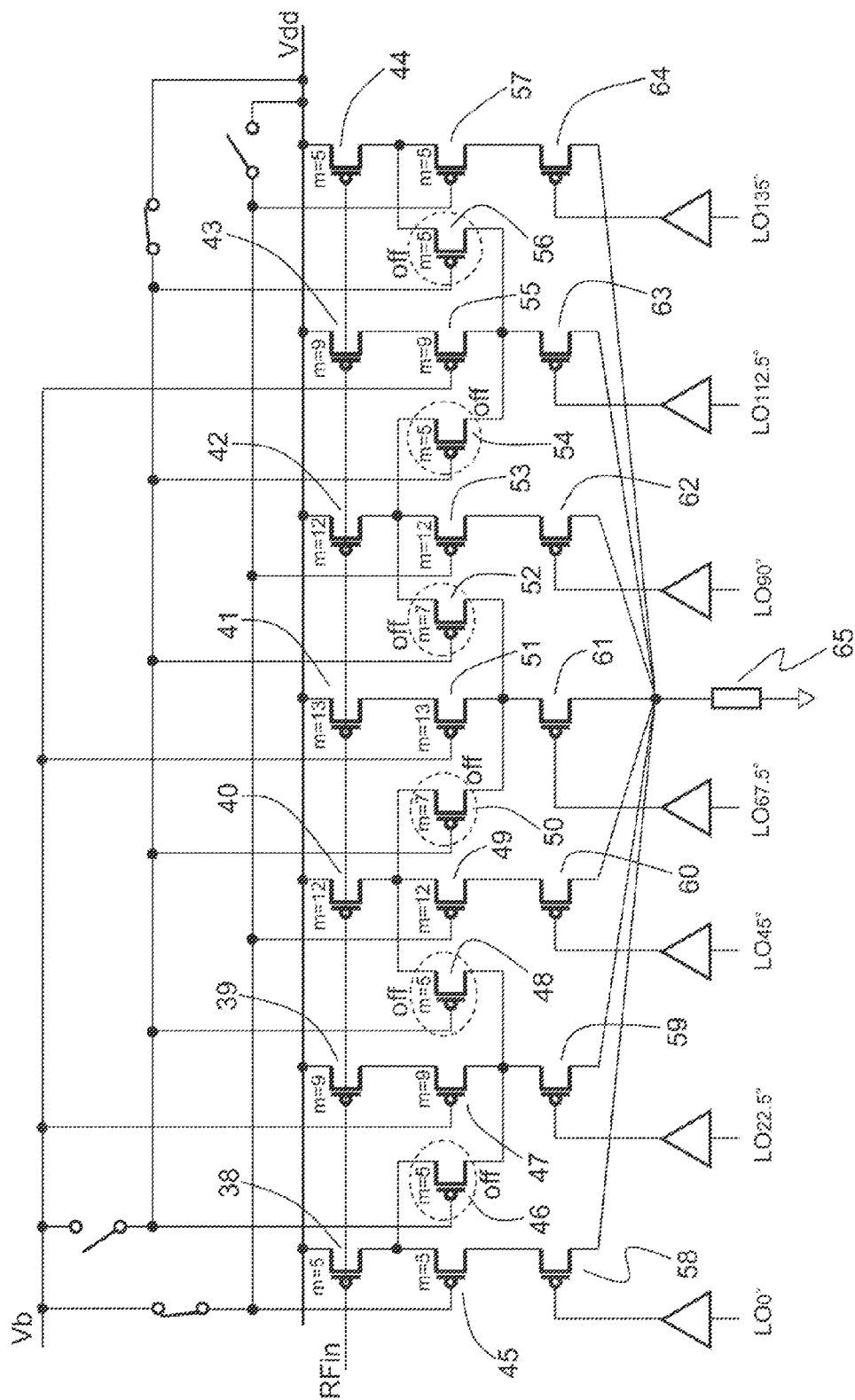
FIG. 8 is a configuration diagram when the HRM according to Embodiment 3 of the present invention operates as a 7-phase HRM.

FIG. 8 illustrates a case where the HRM operates as a 7-phase HRM (hereinafter described as "during 7-phase operation"). As shown in FIG. 8, the gates of transistors 45, 47, 49, 51, 53, 55 and 57 are each given a bias voltage Vb. Transistors 46, 48, 50, 52, 54 and 56 are turned OFF. LO signals are turned ON for all seven phases.

Figure 9:
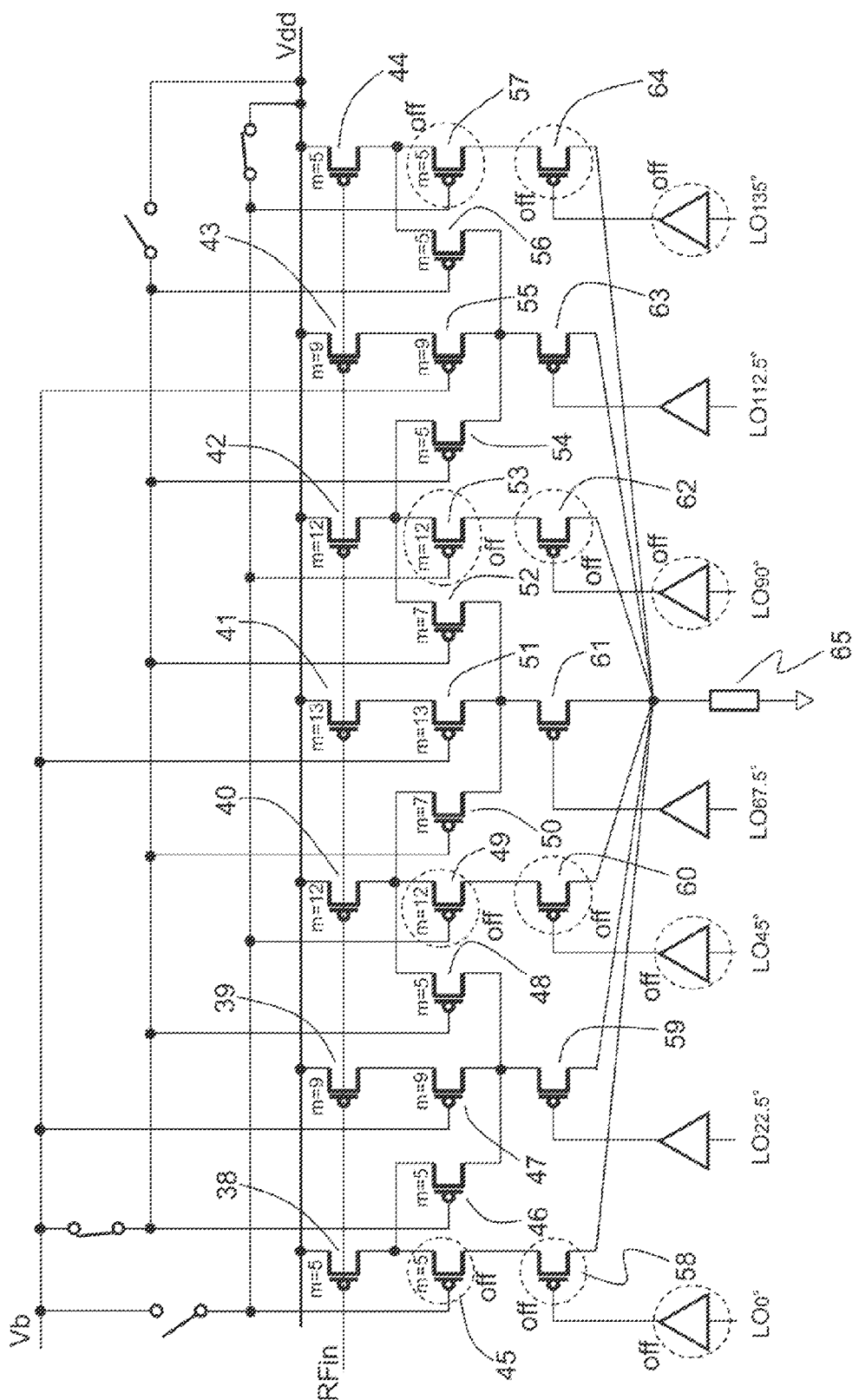
FIG. 9 is a configuration diagram when the HRM according to Embodiment 3 of the present invention operates as a 3-phase HRM.

FIG. 9 illustrates a case where the HRM operates as a 3-phase HRM (hereinafter described as "during 3-phase operation"). As shown in FIG. 9, the gates of transistors 46, 47, 48, 50, 51, 52, 54, 55 and 56 are given a bias voltage Vb. Transistors 45, 49, 53 and 57 are turned OFF. As for LO signals, LO__22.5°, LO__67.5° and LO__112.5° are turned ON, and LO__0°, LO__45°, LO__90° and LO__135° are turned OFF.

As described above, the size ratio of transistor 48 and transistor 50 is set to 5:7. Thus, during 3-phase operation, transistor 48 and transistor 50 distribute the gm current produced at transistor 40 to transistor 59 switched by LO__22.5° and transistor 61 switched by LO__67.5° based on the ratio of 5:7.

As described above, the size ratio of transistor 54 and transistor 52 is set to 5:7. Thus, during 3-phase operation, transistor 54 and transistor 52 distribute the gm current produced at transistor 42 to transistor 63 switched by LO__112.5° and transistor 61 switched by LO__67.5° based on the ratio of 5:7.

During 3-phase operation, transistor 46 distributes all the gm current produced at transistor 38 to transistor 59 switched by LO__22.5°.

During 3-phase operation, transistor 56 distributes all the gm current produced at transistor 44 to transistor 63 switched by LO__112.5°.

By so doing, the ratio of gm currents switched by LO__22.5°, LO__67.5° and LO__112.5° during 3-phase operation becomes 5+9+5:7+13+7:5+9+5=19:27:19. This is substantially 1:√2:1, and this becomes a gain ratio to operate as a 3-phase HRM.

As described above, the HRM of the present embodiment is provided with transistors 45 to 57 that function as switches for changing the number of phases, and can thereby operate either as a 7-phase HRM or as a 3-phase HRM without a substantial increase in the circuit area. In other words, switching to a 3-phase HRM is possible by adding six cascode transistors (transistors 46, 48, 50, 52, 54 and 56) to seven cascode transistors (transistors 45, 47, 49, 51, 53, 55 and 57) that constitute a 7-phase HRM. The ratio of cascode transistors is 5+9+12+13+12+9+5=65 during 7-phase operation, whereas it is 5+5+7+7+5+5=34 during 3-phase operation, and therefore it is possible to realize both the 7-phase HRM and the 3-phase HRM by only using approximately 1.5 times as many cascode transistors. That is, the HRM of the present embodiment is capable of supporting wideband reception without any increase in the circuit area.

Embodiment 4

Figure 10:
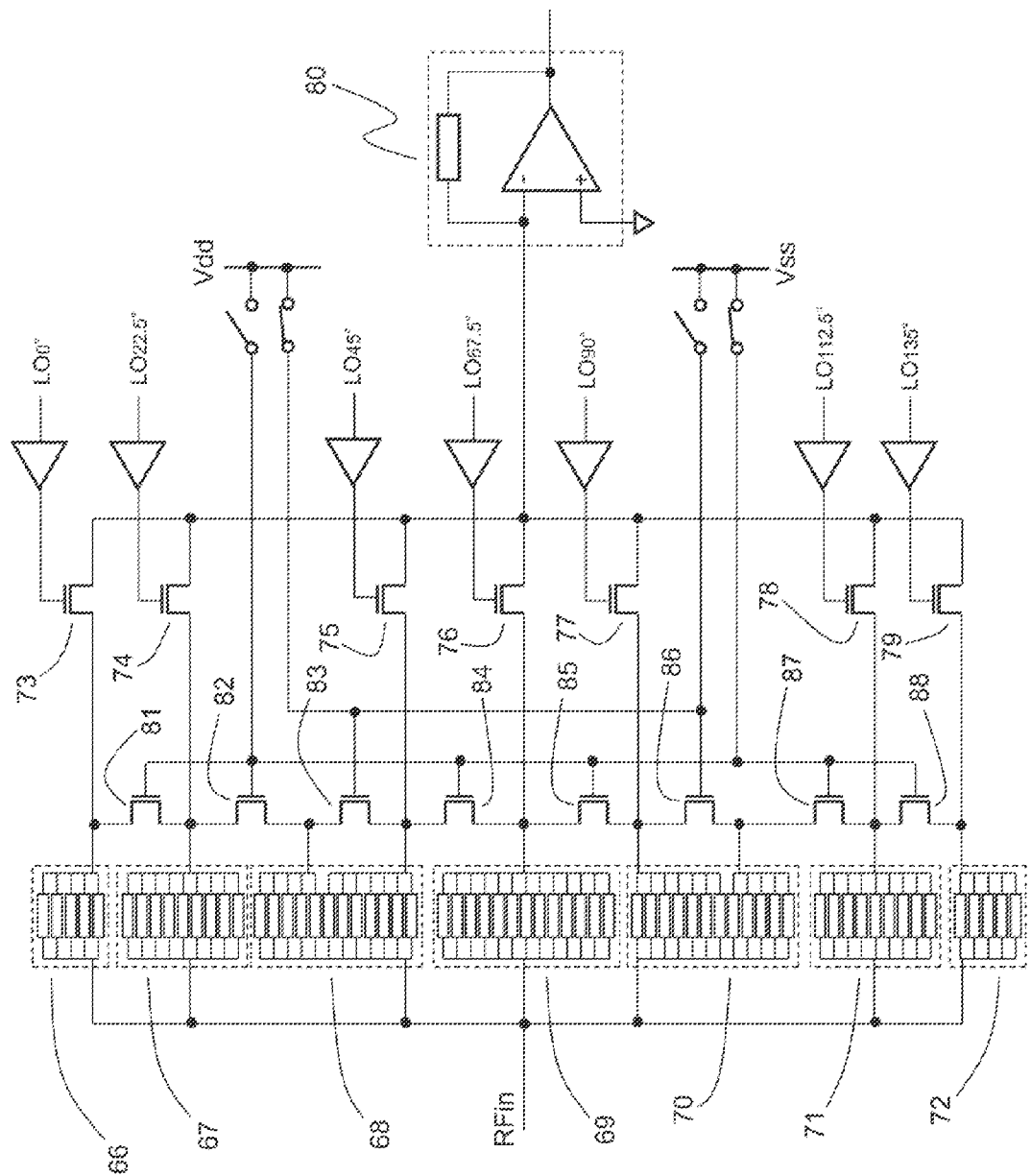
FIG. 10 is a configuration diagram of an HRM according to Embodiment 4 of the present invention.

Embodiment 4 of the present invention will be described. An HRM according to the present embodiment is switchable between 7-phase and 3-phase HRMs and adopts a configuration using resistors for gain devices. FIG. 10 illustrates a configuration example of the HRM according to the present embodiment.

In FIG. 10, resistors 66 to 72 are devices that receive an RF signal and convert the RF signal to a current. The ratio of resistance values of resistors 66 to 72 is 1/5:1/9:1/12:1/13:1/12:1/9:1/5. In this way, the ratio of conversion to a current becomes 5:9:12:13:12:9:5. The ratio of resistance values 1/5:1/9:1/12:1/13:1/12:1/9:1/5 is realized by connecting 5 unit resistors having resistance value R in parallel, connecting 9 unit resistors in parallel, connecting 12 unit resistors in parallel, connecting 13 unit resistors in parallel, connecting 12 unit resistors in parallel, connecting 9 unit resistors in parallel, and connecting 5 unit resistors in parallel.

Transistors 73 to 79 are switching devices that receive LO signals whose phases differ by 22.5° from one another and perform frequency conversion. The LO signals are LO__0°, LO__22.5°, LO__45°, LO__67.5°, LO__90°, LO__112.5° and LO__135°.

The gates of transistors 81 to 88 are each given a bias voltage Vb or a supply voltage Vss. Transistors 81 to 88 function as switches for changing the number of phases.

Feedback operational amplifier 80 is an adder that adds up currents switched by transistors 73 to 79 and converts the resultant current to a voltage.

In the HRM of the present embodiment, changeover between 7 phases and 3 phases is possible by using transistors 81 to 88 as switches for changing the number of phases. Thus, the HRM of the present embodiment in the configuration shown in FIG. 10 can operate as a 7-phase HRM as well as a 3-phase HRM.

Figure 11:
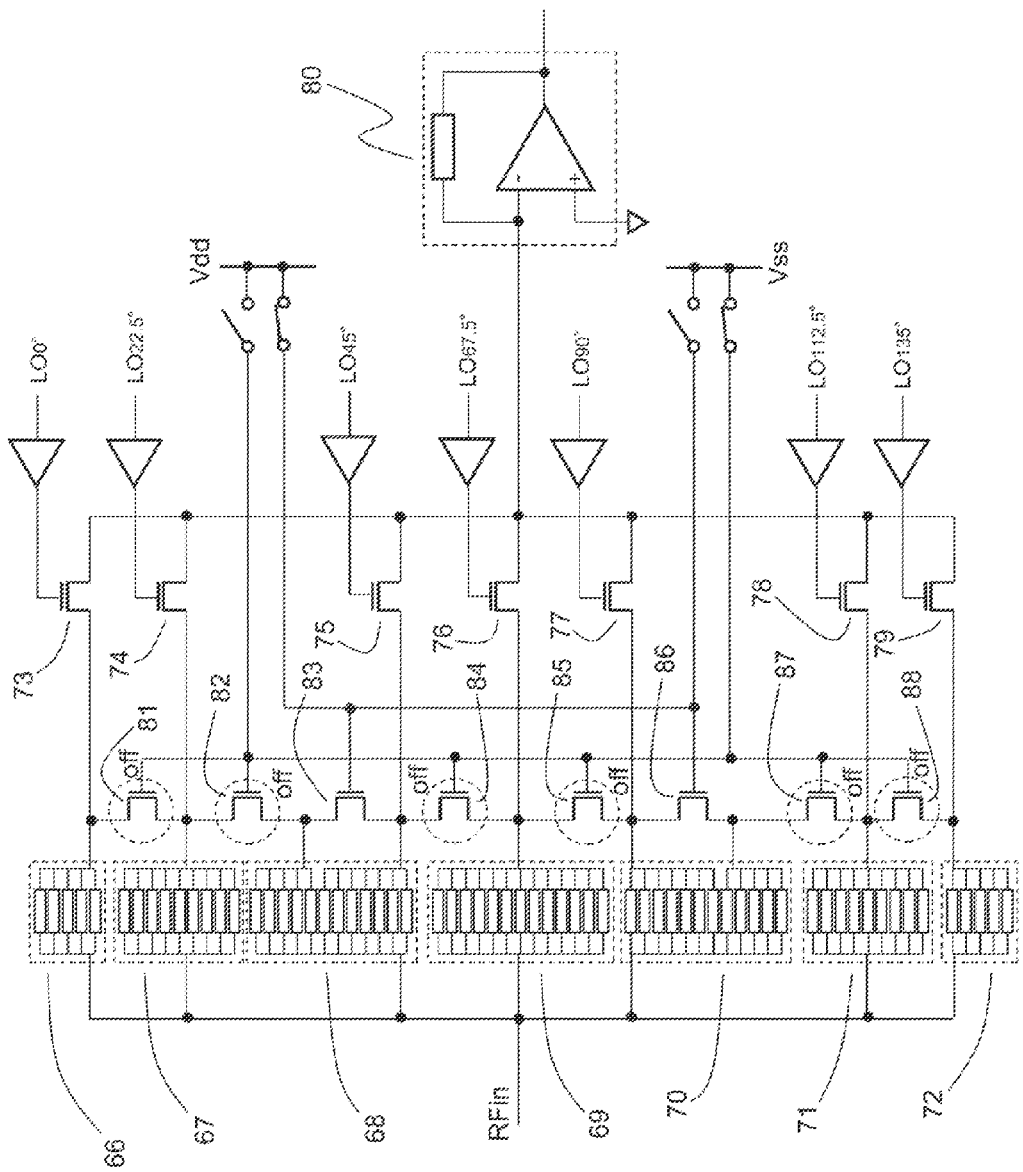
FIG. 11 is a configuration diagram when the HRM according to Embodiment 4 of the present invention operates as a 7-phase HRM.

FIG. 11 illustrates a configuration during 7-phase operation. As shown in FIG. 11, of transistors 81 to 88, transistors 83 and 86 are turned ON, and transistors 81, 82, 84, 85, 87 and 88 are turned OFF. LO signals are given for all seven phases.

Figure 12:
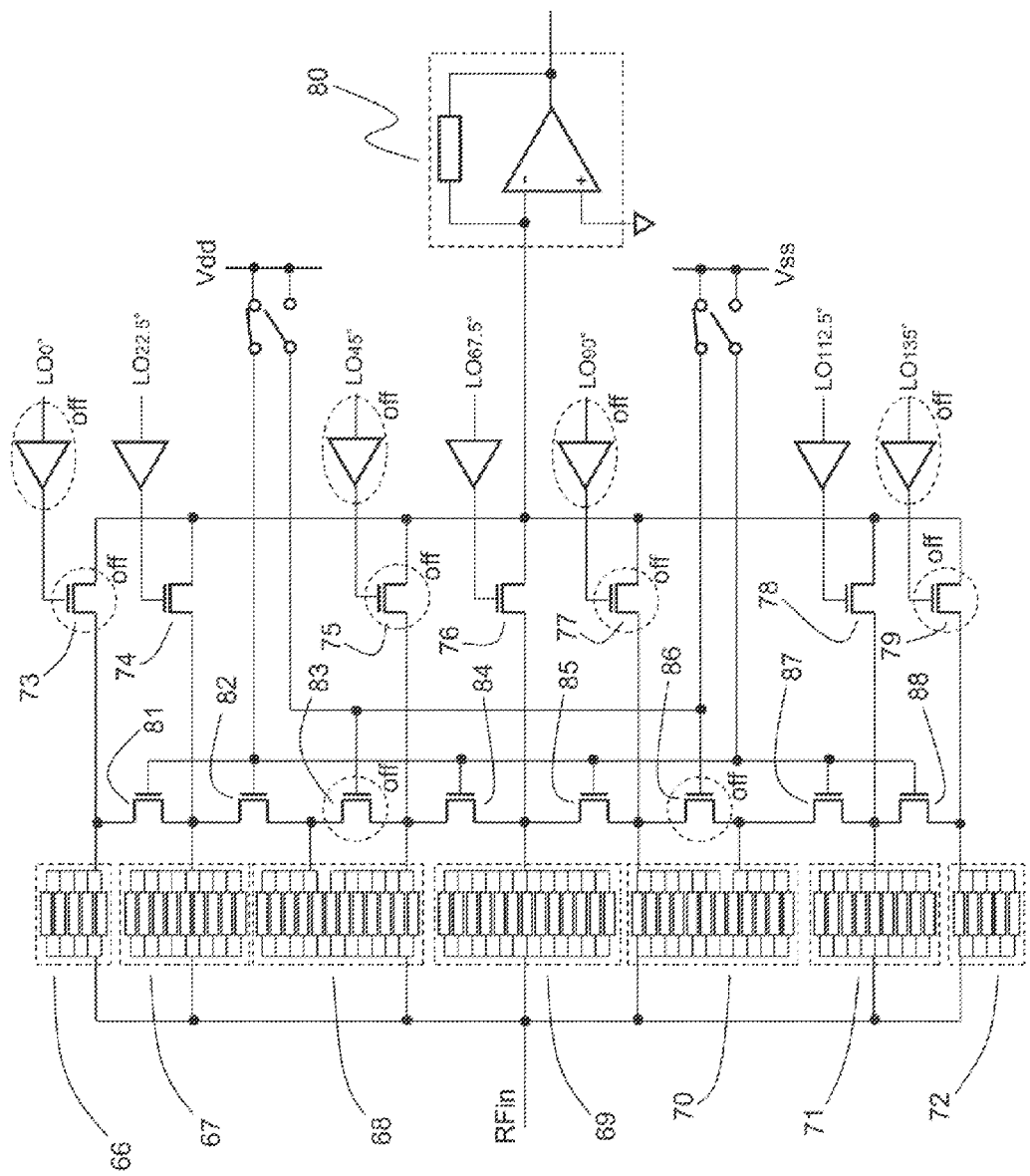
FIG. 12 is a configuration diagram when the HRM according to Embodiment 4 of the present invention operates as a 3-phase HRM.

FIG. 12 illustrates a configuration during 3-phase operation. As shown in FIG. 12, of transistors 81 to 88, transistors 81, 82, 84, 85, 87 and 88 are turned ON, and transistors 83 and 86 are turned OFF. As for LO signals, LO__22.5°, LO__67.5° and LO__112.5° are turned ON, and LO__0°, LO__45°, LO__90° and LO__135° are turned OFF.

By so doing, the ratio of currents switched by LO__22.5°, LO__67.5° and LO__112.5° during 3-phase HRM operation is 5+9+5:7+13+7:5+9+5=19:27:19. Since this is substantially 1:√2:1, this becomes a gain ratio for operating as a 3-phase HRM.

As described above, the HRM of the present embodiment includes transistors 81 to 88 that function as switches for changing the number of phases, and can thereby operate either as a 7-phase HRM or a 3-phase HRM without a substantial increase in the circuit area. That is, the HRM of the present embodiment is capable of supporting wideband reception without any increase in the circuit area.

The embodiments of the present invention have been described so far, but the above description is only an example, and various modifications can be made thereto.

The disclosure of Japanese Patent Application No. 2013-035629, filed on Feb. 26, 2013, including the specification, drawings and abstract is incorporated herein by reference in its entirety.

INDUSTRIAL APPLICABILITY

The present invention is applicable to general techniques for changing between configurations of a harmonic rejection mixer operating in a wideband, and is effective in a system operating in a plurality of frequency bands such as a wireless sensor system.

REFERENCE SIGNS LIST

1, 2, 3, 4, 5 gm transistor
6, 7, 8, 9, 10, 11, 12, 13, 14 Changeover transistor
15, 16, 17, 18, 19 Switching transistor
20 Load
21, 22, 23, 24, 25 Resistor
26, 27, 28, 29, 30 Switching transistor
31 Feedback operational amplifier
32, 33, 34, 35, 36, 37 Changeover transistor
38, 39, 40, 41, 42, 43, 44 gm transistor
45, 46, 47, 48, 49, 50, 51, 52, 53, 54, 55, 56, 57 Changeover transistor
58, 59, 60, 61, 62, 63, 64 Switching transistor
65 Load
66, 67, 68, 69, 70, 71, 72 Resistor
73, 74, 75, 76, 77, 78, 79 Switching transistor
80 Feedback operational amplifier
81, 82, 83, 84, 85, 86, 87, 88 Changeover transistor

The invention claimed is:

1. A harmonic rejection mixer comprising:
   five gain devices that convert a radio frequency signal to currents;
   five switching devices that perform frequency conversion based on the currents from the gain devices and local oscillation signals;
   an adder that is connected with the five switching devices and adds up the currents from the five switching devices and that converts the resultant current to a voltage; and
   a changeover switch that is connected with the five gain devices and the five switching devices and distributes the currents from the gain devices to the five switching devices or two switching devices based on a predetermined ratio;
   wherein, when the currents from the five gain devices are distributed to the five switching devices, the predetermined ratio is approximately sin(30°):sin(60°):sin(90°):sin(120°):and sin(150°), and
   when the currents from the five gain devices are distributed to the two switching devices, the predetermined ratio is approximately 1:1.

2. The harmonic rejection mixer according to claim 1, wherein the gain devices are transistors and the adder is a load.

3. The harmonic rejection mixer according to claim 2, wherein the predetermined ratio is a ratio of sizes of the changeover switches.

4. The harmonic rejection mixer according to claim 1, wherein the gain devices are resistors and the adder is a feedback operational amplifier.

5. The harmonic rejection mixer according to claim 4, wherein the predetermined ratio is a ratio of reciprocals of resistance values of the resistors.

6. A harmonic rejection mixer comprising:
   seven gain devices that convert a radio frequency signal to currents;
   seven switching devices that perform frequency conversion based on the currents from the gain devices and local oscillation signals;
   an adder that is connected with the seven switching devices and adds up the currents from the five switching devices and that converts the resultant current to a voltage; and
   a changeover switch that is connected with the seven gain devices and the seven switching devices and distributes the currents from the seven gain devices to the seven switching devices or three switching devices based on a predetermined ratio;
   wherein, when the currents from the seven gain devices are distributed to the seven switching devices, the predetermined ratio is approximately sin(22.5°):sin(45°):sin(67.5°):sin(90°):sin(112.5°):sin(135°): and sin(157.5°), and
   when the currents from the seven gain devices are distributed to the three switching devices, the predetermined ratio is approximately 1:√2:1.

* * * * *